(12) United States Patent
Banwell (10) Patent No.: US 10,014,955 B1
(45) Date of Patent: Jul. 3, 2018

(54) SIGNAL PROCESSING CIRCUIT WITH OPTICAL LOCAL OSCILLATOR SIGNAL

(71) Applicant: Vencore Labs, Inc., Basking Ridge, NJ (US)

(72) Inventor: Thomas Banwell, Basking Ridge, NJ (US)

(73) Assignee: Vencore Labs, Inc., Basking Ridge, NJ (US)

( * ) Notice: Subject to any disclaimer, the term of this patent is extended or adjusted under 35 U.S.C. 154(b) by 54 days.

(21) Appl. No.: 15/136,528

(22) Filed: Apr. 22, 2016

Related U.S. Application Data

(60) Provisional application No. 62/152,538, filed on Apr. 24, 2015.

(51) Int. Cl.
  *H04B 10/2575* (2013.01)
  *H04B 10/61* (2013.01)
  *H03L 7/20* (2006.01)

(52) U.S. Cl.
  CPC ........... *H04B 10/6164* (2013.01); *H03L 7/20* (2013.01); *H04B 10/2575* (2013.01)

(58) Field of Classification Search
  None
  See application file for complete search history.

(56) References Cited

U.S. PATENT DOCUMENTS

| | | | | | |
|---|---|---|---|---|---|
| 5,272,556 | A * | 12/1993 | Faulkner | ................. | H04N 7/22 348/E7.094 |
| 5,995,256 | A * | 11/1999 | Fee | ..................... | H04J 14/0298 398/1 |
| 6,215,565 | B1 * | 4/2001 | Davis | ..................... | H04B 10/03 398/17 |
| 6,963,442 | B2 * | 11/2005 | Yap | ......................... | G02F 2/002 359/326 |
| 7,302,178 | B2 * | 11/2007 | Carrick | ................ | H04B 10/077 340/3.1 |
| 7,978,401 | B2 * | 7/2011 | Hasegawa | .......... | G02B 6/12007 359/325 |
| 8,103,175 | B1 * | 1/2012 | Kowalczyk | ...... | H04B 10/25759 359/334 |
| 8,406,621 | B2 * | 3/2013 | Painchaud | ........... | H04B 10/676 398/16 |
| 8,879,916 | B1 * | 11/2014 | Ng | .................... | H04B 10/25759 398/115 |
| 9,197,471 | B1 * | 11/2015 | Zanoni | .................. | H04L 27/223 |
| 9,287,993 | B1 * | 3/2016 | Adleman | ........... | H04B 10/2575 |
| 2003/0231889 | A1 * | 12/2003 | Brown | ................ | H04B 10/505 398/186 |
| 2005/0111789 | A1 * | 5/2005 | Hayes | .................... | H04B 10/60 385/27 |

(Continued)

*Primary Examiner* — Li Liu (74) *Attorney, Agent, or Firm* — Heslin Rothenberg Farley & Mesiti P.C.; George Blasiak (57) ABSTRACT

Provided are apparatus including a signal processing circuit. The signal processing circuit may be configured to process an input signal having an input bandwidth spanning a range of input radio frequencies, and may include a local oscillator to produce a local oscillator signal. In one embodiment, the signal processing circuit can include a staring mode of operation. In one embodiment, the signal processing circuit can include a selective mode of operation. In one embodiment, the signal processing circuit can include a staring mode of operation and a selective mode of operation.

25 Claims, 8 Drawing Sheets

(56) References Cited

U.S. PATENT DOCUMENTS

| | | | | |
|---|---|---|---|---|
| 2007/0009205 A1* | 1/2007 | Maleki | ................... | G02B 6/122 |
| | | | | 385/27 |
| 2010/0111545 A1* | 5/2010 | Banwell | ............. | H04B 10/2575 |
| | | | | 398/208 |
| 2011/0234435 A1* | 9/2011 | Woodward | ............ | H03M 1/124 |
| | | | | 341/137 |
| 2012/0008955 A1* | 1/2012 | Shen | ....................... | H04J 14/02 |
| | | | | 398/79 |
| 2012/0027401 A1* | 2/2012 | Wood | ....................... | H04B 1/28 |
| | | | | 398/9 |
| 2012/0315049 A1* | 12/2012 | Banwell | ........... | H04B 10/25759 |
| | | | | 398/115 |
| 2013/0177319 A1* | 7/2013 | Middleton | ........... | H01Q 3/2676 |
| | | | | 398/115 |
| 2014/0328588 A1* | 11/2014 | Sakai | ................ | H04B 10/6164 |
| | | | | 398/38 |
| 2015/0256266 A1* | 9/2015 | Duthel | ................ | H04B 10/616 |
| | | | | 398/38 |
| 2017/0141844 A1* | 5/2017 | Sakamoto | ............ | H04B 10/079 |

* cited by examiner

SIGNAL PROCESSING CIRCUIT WITH OPTICAL LOCAL OSCILLATOR SIGNAL

CROSS-REFERENCE TO RELATED APPLICATIONS

This application claims priority to U.S. Provisional Application No. 62/152,538 filed Apr. 24, 2015, entitled, "SIGNAL PROCESSING CIRCUIT WITH FREQUENCY DOMAIN FOLDER" which is incorporated herein by reference in its entirety.

GOVERNMENT RIGHTS STATEMENT

The Government has certain rights in the invention.

FIELD

The present disclosure relates to signal processing circuits in general, and more specifically signal processing circuits including an optical local oscillator signal.

BACKGROUND

Radio frequency (RF) signal analysis may be important in many applications. For example, the ability to scan a wide range of radio frequencies to identify signals of interest, such as enemy radio communications, may be of importance to military and intelligence operations. Analyzing wide band frequency spectrums may require using multiple radio frequency antennae, scanning through a received wide-band, or other techniques that may be costly and/or time-consuming. Systems and apparatus that can more efficiently and effectively provide RF signal analysis may be significant in a wide range of applications. RF signal analysis can include, e.g., receiving and/or processing a wide range of radio frequencies to identify signals of interest and/or receiving and/or processing a narrow band radio signal (narrow band relative to the range of RF input).

BRIEF DESCRIPTION

The shortcomings of the prior art are overcome and additional advantages are provided through the provision, in one aspect, of an apparatus having a signal processing circuit configured to process an input signal having an input bandwidth spanning a range of input radio frequencies, and may include a local oscillator to produce a local oscillator signal. In one embodiment, the signal processing circuit can include a staring mode of operation. In one embodiment, the signal processing circuit can include a selective mode of operation. In one embodiment, the signal processing circuit can include a staring mode of operation and a selective mode of operation.

The shortcomings of the prior art are overcome and additional advantages are provided through the provision, in one aspect, of an apparatus including a signal processing circuit that processes an input signal, the input signal having an input bandwidth spanning a range of input radio frequencies, and the signal processing circuit having a local oscillator that produces a local oscillator signal comprising a plurality of signal components; wherein the signal processing circuit is operative so that the input signal and local oscillator signal are combined to produce an output signal, the output signal having a fixed output bandwidth, and the output signal reproducing the range of input radio frequencies within the fixed output bandwidth.

The shortcomings of the prior art are overcome and additional advantages are provided through the provision, in one aspect, of an apparatus including a signal processing circuit that includes a first mode and a second mode. In the first mode a first spectrally shaped local oscillator signal can be combined with an input signal. In a second mode a second spectrally shaped local oscillator signal can be combined with an input signal. In one embodiment, the first spectrally shaped local oscillator signal can include a multi-comb line local oscillator signal that is combined with an input signal having a range of frequencies to produce an output signal, the output signal having the range of frequencies of the input signal. In one embodiment, the second spectrally shaped local oscillator signal can be a single comb line local oscillator signal that is combined with a narrow band input signal to produce an output signal representative of the narrow band input signal.

The shortcomings of the prior art are overcome and additional advantages are provided through the provision, in one aspect, of an apparatus including a signal processing circuit that processes an input signal, the input signal having a frequency, and the signal processing circuit having a local oscillator that produces a local oscillator signal; wherein the signal processing circuit is operative so that the input signal and local oscillator signal are combined to produce an output signal, wherein signal processing circuit is configured so that a higher order harmonic optical signal is output by an optical circuit section of the signal processing circuit.

DETAILED DESCRIPTION

Figure 1:
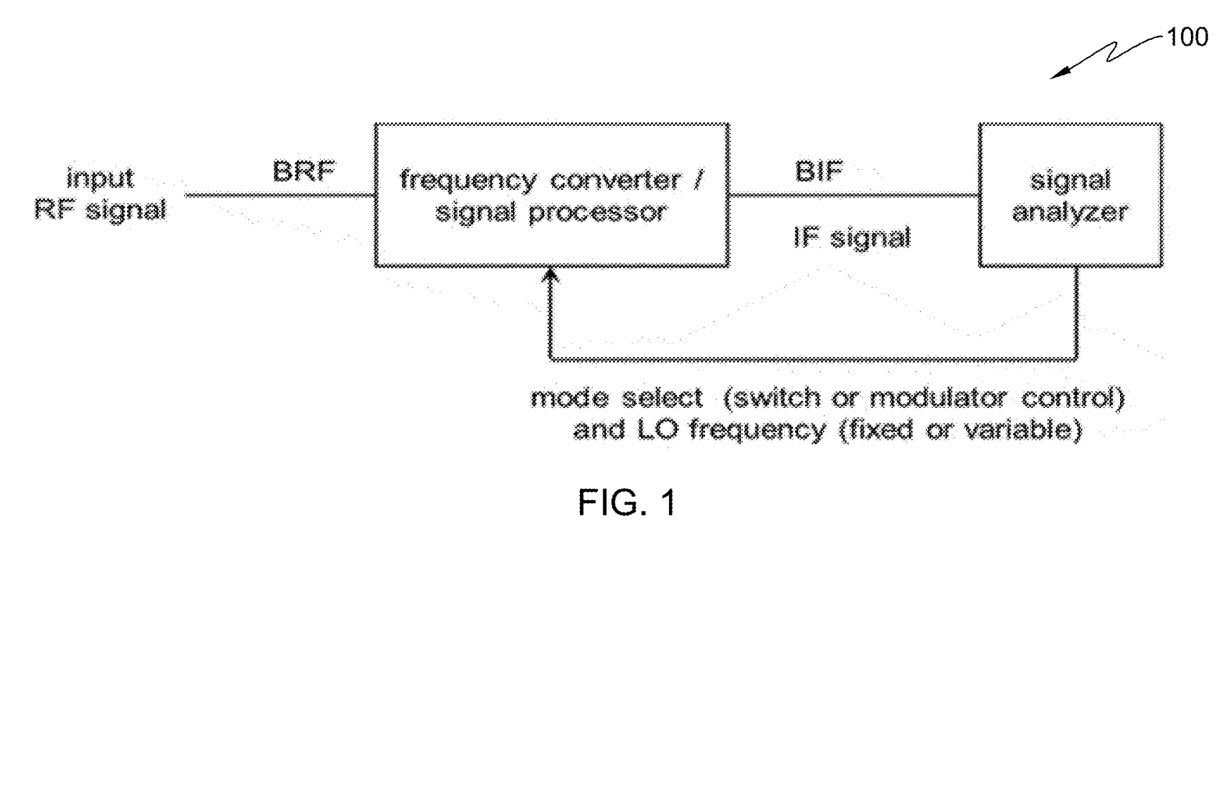
FIG. 1 is a schematic diagram of an electro-optical signal processing circuit with dual mode operation.

In one embodiment, there is set forth herein an apparatus including a signal processing circuit 100 that has first and second (e.g. two) modes of operation that depend on a rapidly configurable optical local-oscillator waveform: wide-band queuing or staring receiver and narrow band pre-selector. One exemplary system including an electro-optical signal processing circuit 100 is illustrated by FIG. 1.

The system accepts an RF electrical input signal of bandwidth Bsig which may be anywhere in a frequency range BRF and produces an IF electrical signal with a bandwidth BIF. In the staring mode, the circuit creates n>1 optical local comb lines and the entire 2n×BIF bandwidth is folded onto an IF output with bandwidth BIF as indicated e.g. in FIGS. 2 and 3. This operation can be thought of as frequency domain folding and the system as including a frequency domain folder. The bandwidth is determined by the electrical IF filter BIF and can be a few MHz to several GHz, as desired. The center frequency of the RF signal may be determined from the relative motion of the IF frequency as the local oscillator is dithered or varied.

Figure 2:
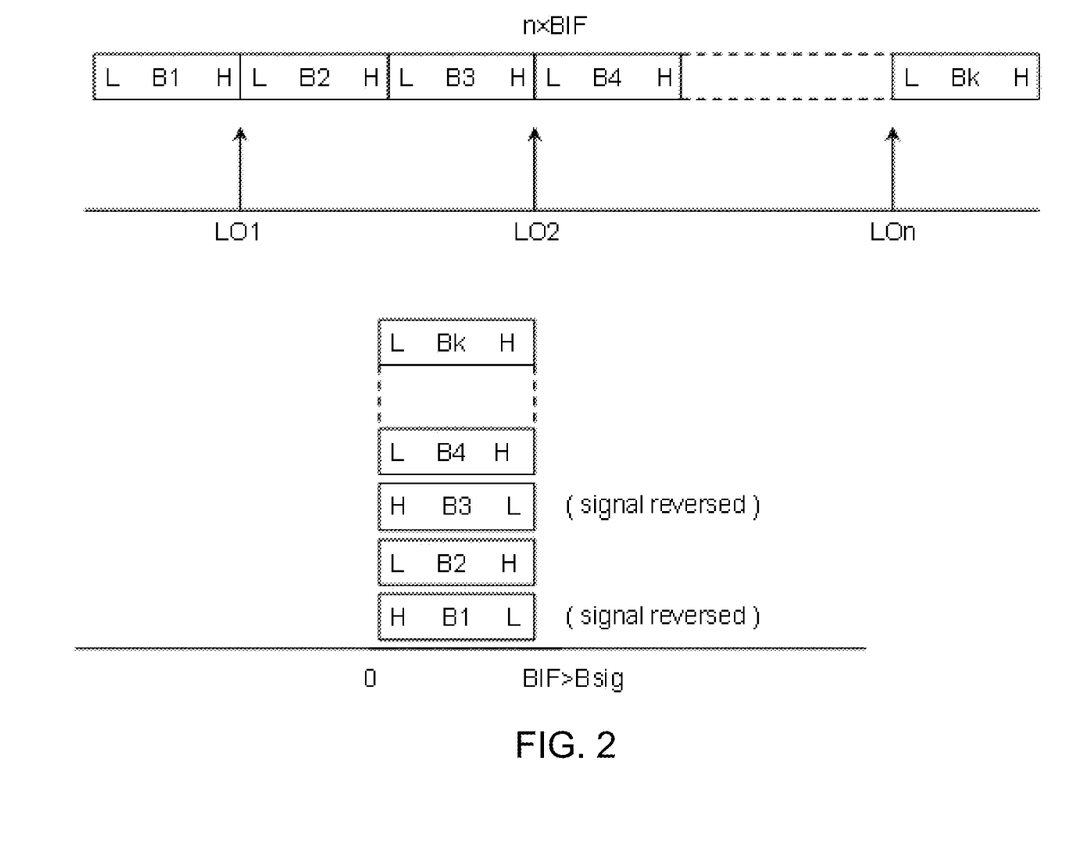
FIG. 2 is a diagram illustrating a pass-band approach to wideband signal folding.

By reconfiguring the local oscillator to a single frequency (n=1), the RF signal is down-converted to an IF signal provided that BIF>Bsig as set forth herein (e.g. in FIG. 2). This represents the second selective mode of operation. The optical LO waveform may be reconfigured in the electrical domain using an electrical switch.

When the signal processing circuit 100 is used with a highly directional antenna, only one or a few signals will be seen due to the restricted angular resolution of the antenna. In this case it may be easy to place the LO at one end to the RF signal spectrum and obtain a pass-band IF whose center frequency is greater than zero. This wideband mode of operation (spectral folding with some inversions) is illustrated in the following FIG. 2.

Figure 3:
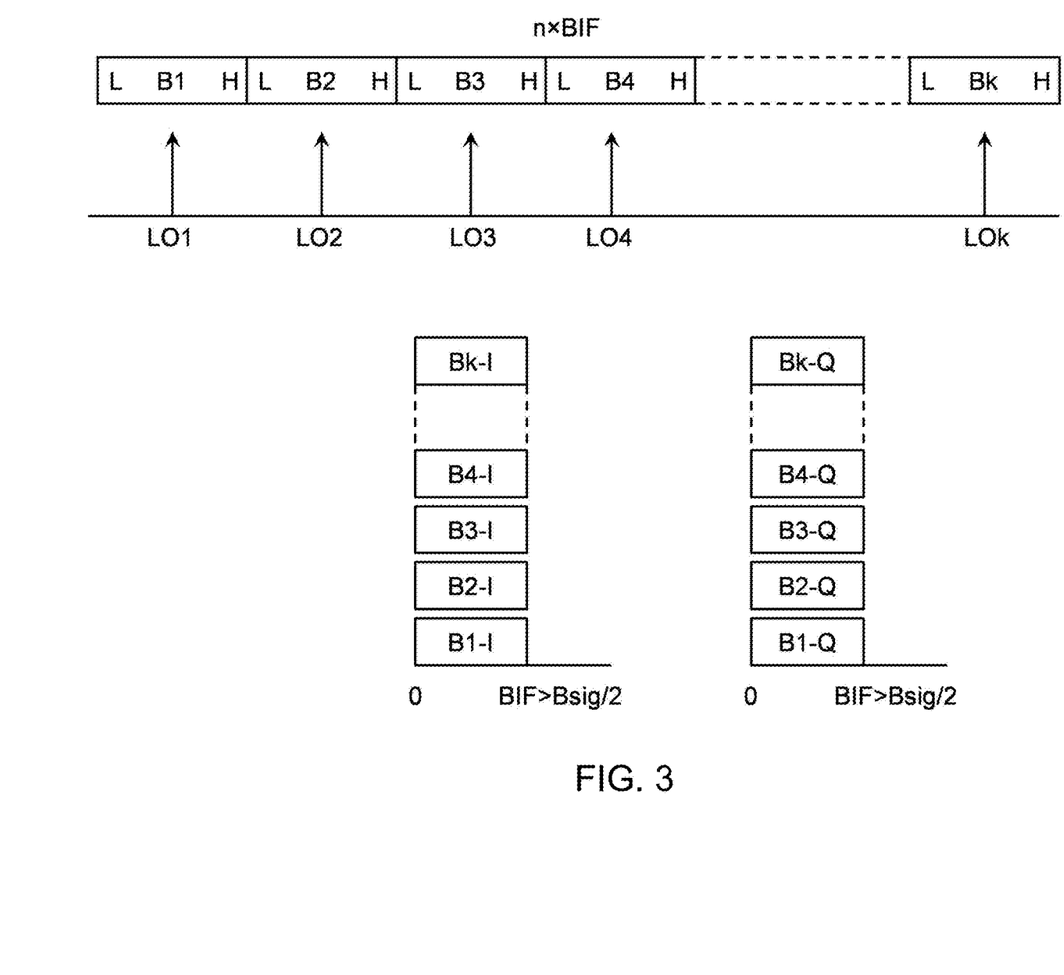
FIG. 3 is a diagram illustrating a base band approach to wideband signal folding.

When the RF input is comprised of very many signals, it may be easier to place the LO at the center of the desired frequency range and derive a base-band IF using a quadrature receiver that includes zero frequency. This method of wideband operation (spectral folding without inversion) is shown in FIG. 3. The optical approach can be optimized for either type of signal: a band-limited RF input signal or a composite wideband RF input signal.

Band-Limited RF Input Signal

Figure 5:
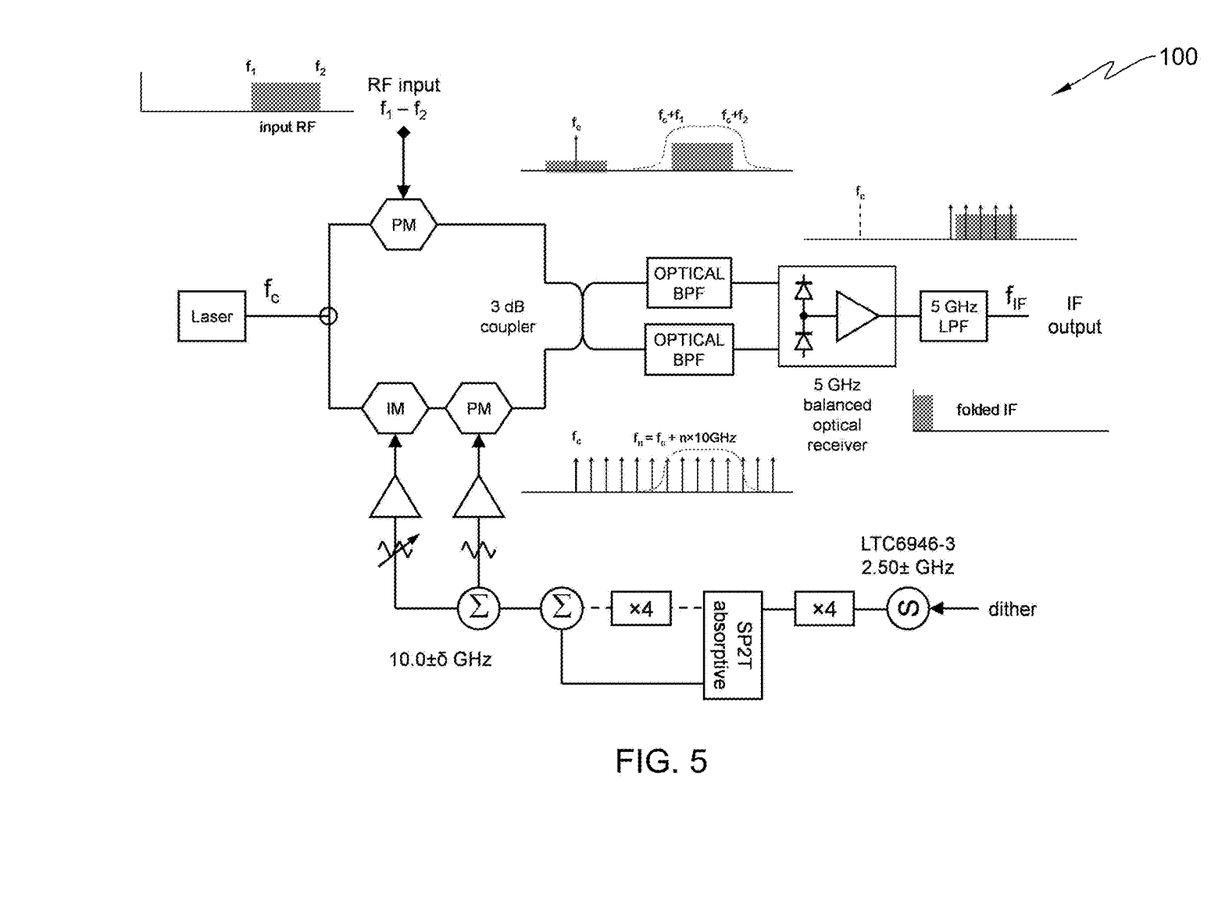
FIG. 5 is a schematic block diagram illustrating an electro-optical signal processing circuit operating in a wideband staring mode.
Figure 6:
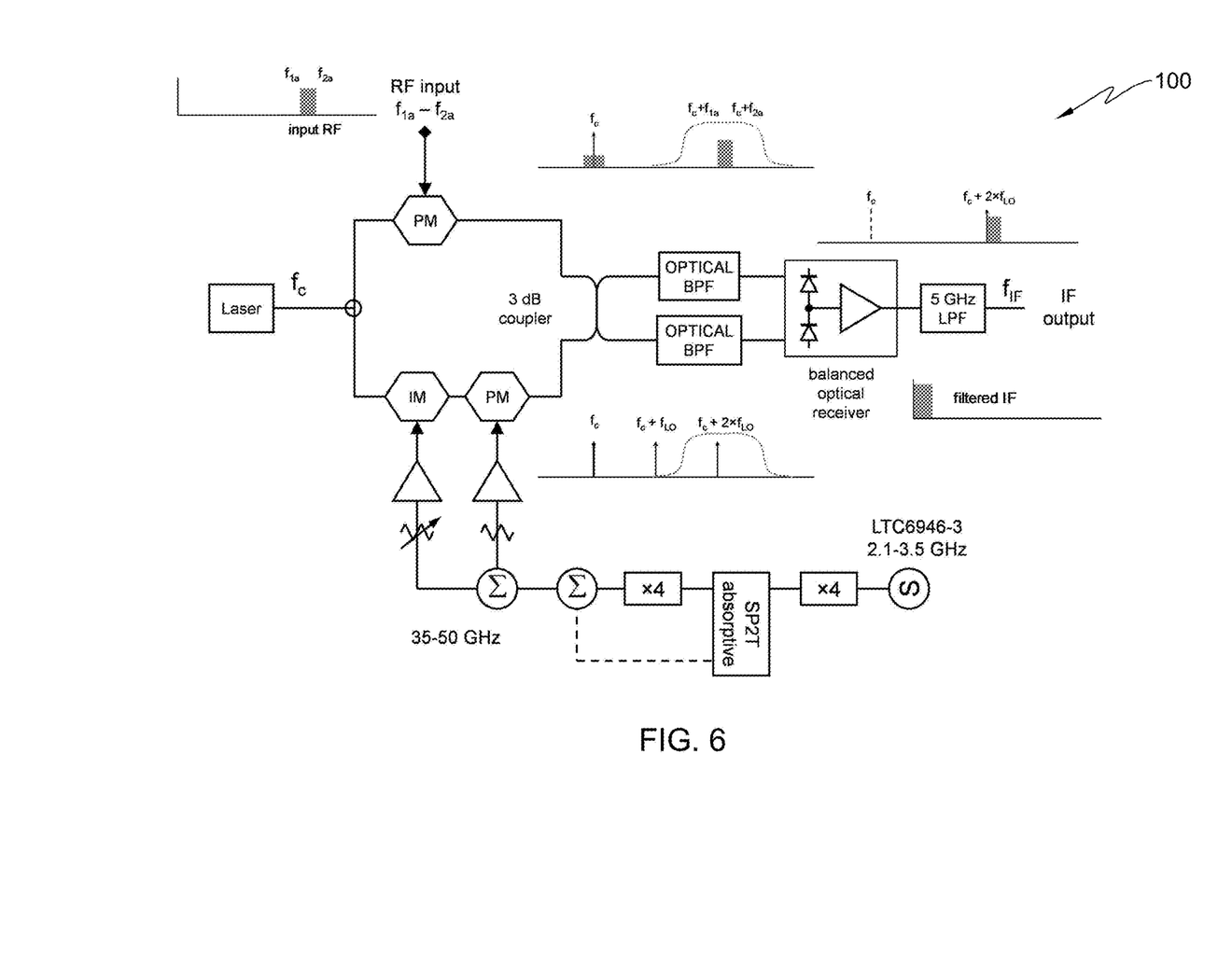
FIG. 6 is a schematic block diagram illustrating an electro-optical signal processing circuit operating in a narrow band selective mode.

The electro-optical frequency domain folder is based on coherent optical signal processing where the RF signal is first translated to an optical frequency and then mixed with a spectrally shaped local oscillator signal to produce a lower frequency IF signal that contains all or part of the input RF energy. This is illustrated, for example, in FIGS. 4-6 illustrating one embodiment.

Figure 4:
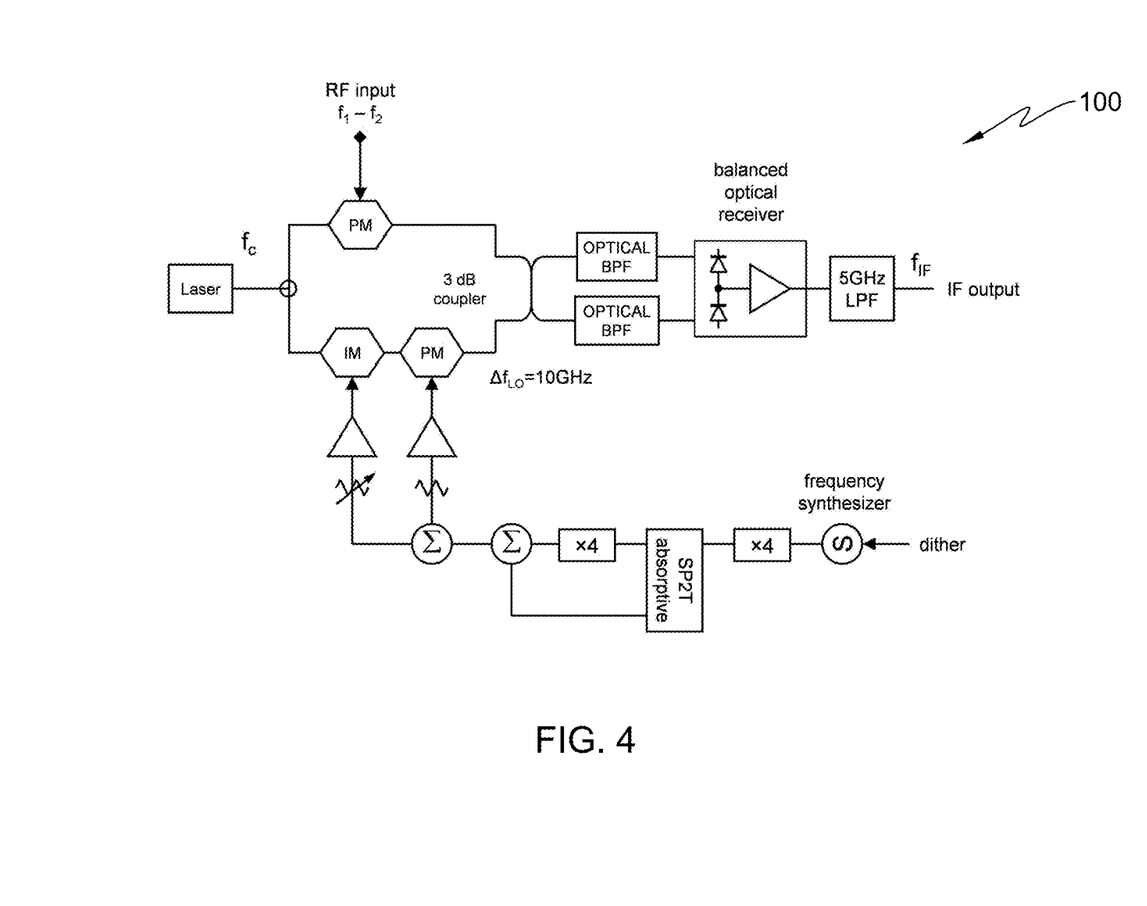
FIG. 4 is a schematic block diagram illustrating an electro-optical signal processing circuit.

A block diagram of a dual mode electro-optical signal processing circuit 100 that performs the function of a frequency domain folder (FDF) is illustrated in the example of FIG. 4. The signal processing circuit 100 of FIG. 4 receives an input RF signal from a source, e.g. an antenna coupled to an RF front end. The input RF signal is incident on the upper phase modulator (single arm or dual arm MZM configuration). Optical sidebands at $f_c \pm f_{RF}$ are produced by the phase modulator, where $f_{RF}$ spans the frequency range $f_1$ to $f_2$. An optical band-pass filter extracts the first-order upper sideband that now spans $f_c+f_1$ to $f_c+f_2$. An optical band-pass filter can alternatively or in addition extract the first-order lower sideband that spans $f_c-f_1$ to $f_c-f_2$. The optical RF signal is combined with an optical LO signal in a 3 dB optical coupler and converted to an electrical IF signal using a balanced receiver. The electrical low-pass filter at the output of the balanced optical receiver determines the IF bandwidth. The signal processing circuit 100 shown may use a 5 GHz filter and 10 GHz LO comb spacing by way of example, but one with skill in the art will recognize that this multi-mode approach can be adapted to other frequencies and comb spacings without deviating from the concepts presented. The optical filter is also used to reject unwanted LO signals. The use of upper and lower sidebands could be used to cover two bands (for example 30-50 GHz and 60-90 GHz) or double the system gain. The latter is not desired as the two sidebands would add interferometrically and the noise would also double. We leave open the option for dual-band operation in a single circuit where the optical bandpass filters are replaced by two demultiplexers that drive two balanced receivers (one for each band).

The upper RF and lower LO paths before the 3 dB coupler constitute an optical interferometer which is sensitive to thermal expansion and vibration effects. This portion of the circuit should be as compact as possible to minimize the unwanted phase modulation. Antenna remoting can be accomplished if both RF and LO signals are conveyed over the same fiber(s), preferably after the 3 dB coupler.

A low noise laser with carrier frequency $f_c \approx 193$ THz provides optical input to electro-optical modulators that constitute the RF and LO signal paths. The folding feature is achieved using a "shaped local oscillator" as illustrated in FIG. 5 which takes the entire input RF frequency range and folds it into $f_{IF}=5$ GHz as described above. The electronic components in the lower portion of FIG. 2 are used to generate the optical LO with uniform amplitude comb lines at a 10 GHz spacing that tracks $f_c$. The lower intensity (IM) and phase (PM) modulators are driven with 10 GHz at $1.57V_\pi$ and $1.85V_\pi$, respectively, according to one embodiment. It should be noted that the bandwidth of the lower modulator can be significantly lower than the RF modulator bandwidth to achieve the desired range of operation. The optical filter selects comb lines within the frequency range of interest. These are combined with the optical RF signal and mixed using the square law response of a balanced optical receiver. The response of the coherent receiver can be written $I_{sig} \propto 4\text{Re}(E_{RF} \cdot E^*_{LO})$ since the receiver rejects common mode terms such as the DC components $|E_{RF}|^2 + |E_{LO}|^2$. In particular, the LO combs do not beat against each other to complicate the IF spectrum.

By restricting the output frequency to 5 GHz, only signals within this range of each LO tone is extracted, resulting in folding of the input spectrum. A frequency dither of $f_{dither}=100$ MHz is applied to the 10 GHz tone and gives a unique signature of n $f_{dither}$ to the $n^{th}$ LO comb line and the IF signals recovered from it.

This method of folding does not provide any spreading gain and all of the noise for each input channel is also combined into $f_{IF}$. Noise associated with each LO comb line in the staring mode will also contribute to the noise in $f_{IF}$. A second selective mode of operation allows for significant noise reduction by using a single LO tone as illustrated in FIG. 6. The lower modulator is driven with a higher frequency (e.g. 33-50 GHz, 35-55 GHz) so that only the second sideband falls within the optical filter's pass band. Only RF signals within 5 GHz of this single tone appear at the IF output. There are other means to obtain a single tone, such as turning off the intensity modulator or reducing the drive level to the phase modulator in the LO path.

The photodetector (PD) summing junction provides a convenient reference point for the calculation of noise and dynamic range performance. The response for filtered sideband phase modulation is given by $$I_{sig}=4\eta\sqrt{P_S P_L} J_1(\beta V_{in})$$

Where $P_S=150$ mW is the optical power into the RF modulator, $P_L=1$ mW is the LO power for each tone, the PD responsivity is $\eta=0.8$ A/W, $\beta \equiv \pi/V_\pi$ for the modulator and $J_1(x)$ denotes the first order Bessel function. The two tone third-order intermodulation is conveniently expressed using $J_1(\beta V_{in}) \rightarrow \sqrt{10.7}$. The system's small signal gain is G $R_{TIA}$ where $G=2\eta\sqrt{P_S P_L}\beta$ and $R_{TIA} \sim 5000\Omega$ is the TIA response.

There are several noise components which correspond to each comb line (one or more)

The PD shot noise for each LO comb is $I_{shot}^2=4q_e\eta P_L B_{IF}$ where the electron charge is $q_e$. The laser relative intensity noise (RIN) contributes $I_{RIN}^2=\epsilon$ RIN $(\eta P_L)^2 B_{IF}$ where ε is the PD matching error and RIN↔−165 dB. The TIA noise current is $I_{TIA}^2 = \sigma_{TIA}^2 B_{IF}$ where the input referred noise density for a 5-10 GHz TIA is $\sigma_{TIA} \approx 9$ pA/√Hz. The (folded) input thermal noise is $I_{input}^2 = 4n\, G^2\, k_B\, T\, R_s B_{IF}$. The spurious free dynamic range is $$SFDR = \frac{20}{3} \log(I_{sig}^2 (\beta V_{IIP3}) / 2I_{noise}^2)$$

where $I_{noise}^2 \sim n\, (I_{shot}^2 + I_{RIN}^2) + I_{TIA}^2 + I_{input}^2$ and n is the number of LO comb lines.

Since each noise term is associated with an LO comb line, there is no advantage using both upper and lower sidebands in a single IF channel. To the contrary, the response for a pass-band signal $V = \rho(t)\sin(\omega_{RF}t + \vartheta(t))$ is $I_{DSB} \propto 2\, \sin(\Delta\omega t + \vartheta)\sin\psi$ $I_{USB} \propto \sin(\Delta\omega t + \vartheta - \psi)$ where $\psi$ is the phase of the LO signals relative to $f_c$. The first expression requires interferometric stabilization of the sin $\psi$ term. The upper and lower sidebands could be used for different frequency ranges, subject to the RF modulators $\beta$ considerations.

A summary of the performance that was calculated using the above expressions is given in Table A below.

TABLE A

| mode | LO number | gain | noise current per LO channel | NF | dynamic range |
|---|---|---|---|---|---|
| wideband high-channel | n = 4 | $V_\pi$ = 8 V<br>G = 0.0077 mho | shot 1.6 µA<br>TIA 0.64 µA | 17 dB | 55 dB |
| selective high-channel | n = 1 | $GR_{TIA}$ = 38 | RIN 0.1 µA<br>input 0.5 µA | 11 dB | 63 dB |
| wideband low channel | n = 2 | $V_\pi$ = 3.3 V<br>G = 0.0187 mho | shot 1.6 µA<br>TIA 0.64 µA | 10 dB | 58 dB |
| selective low channel | n = 1 | $GR_{TIA}$ = 93 | RIN 0.1 µA<br>input 0.88 µA | 7 dB | 62 dB |

When the number of comb lines is included, the wideband NF increases by 6 dB and 3 dB for the two bands respectively and the dynamic range decreases by 8 and 4 dB respectively.

Composite RF Input Signals

The above receiver system uses a pass-band approach that is suitable for band limited signals.

Figure 7:
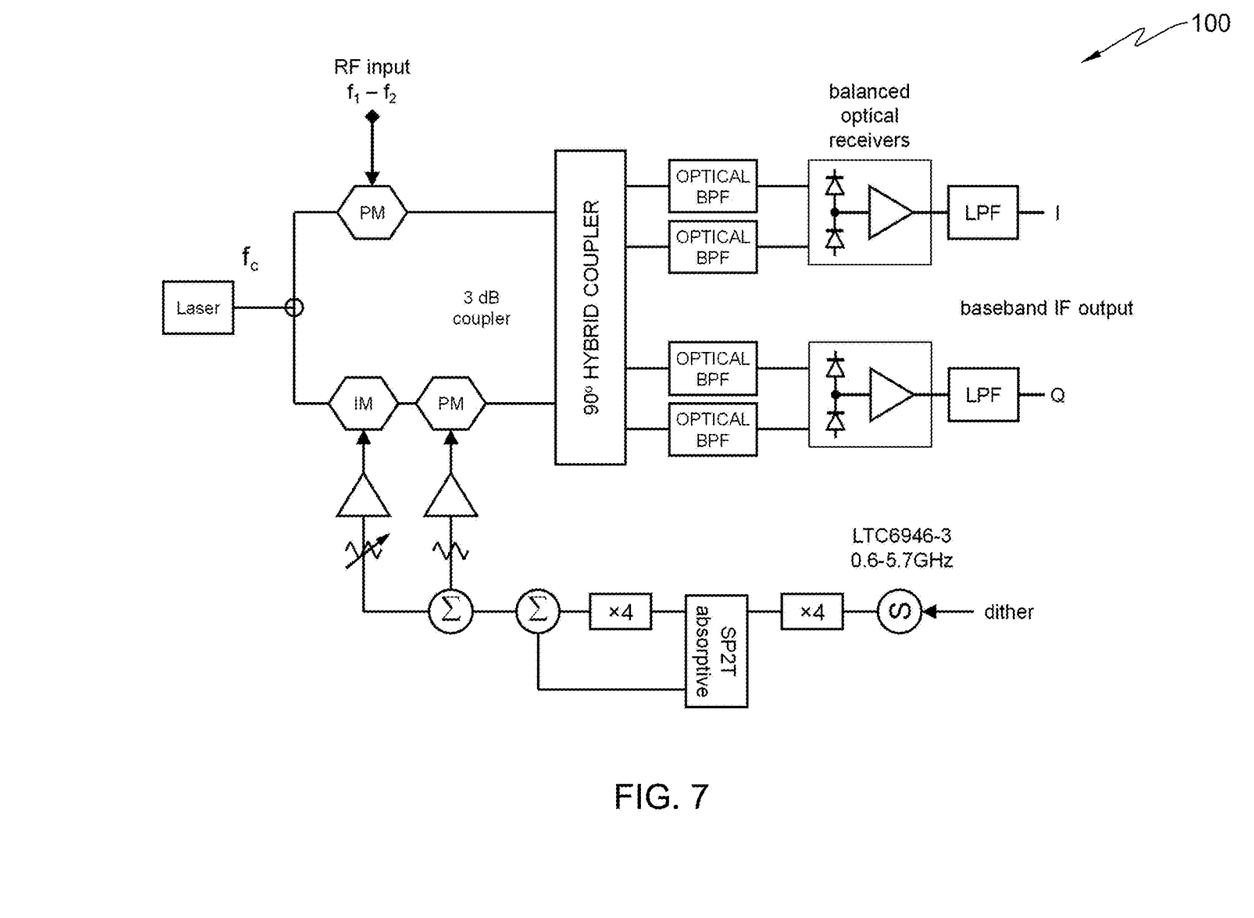
FIG. 7 is a schematic block diagram of an electrical optical signal processing circuit configured for use as a base band IF converter.

The LO may not be readily moved outside of the signal band when there are many signals. The LO may not be readily moved outside of the signal pass band by the requisite amount for pass band operation when there are many signals. In this case the optical signal is converted to IF electrical signal using a receiver capable of recovering both I and Q components. The electrical filter again defines the bandwidth of the receiver. This system is illustrated in FIG. 7 using two balanced receivers to recover I-Q IF signals using a well known quadrature configuration instead of the single (simpler) balance receiver.

Provided in one embodiment are apparatus including a signal processing circuit. The signal processing circuit may be configured to process an input signal having an input bandwidth spanning a range of input radio frequencies, and may include a local oscillator to produce a local oscillator signal that includes a plurality of signal components. The apparatus may, in a wide-band staring mode, combine the input signal and local oscillator signal to produce an output signal. The output signal may have a fixed output bandwidth and reproduce the range of input radio frequencies within the fixed output bandwidth. Combining the input signal and local oscillator signal may include folding the input signal onto the local oscillator signal so that the range of input radio frequencies may be reproduced in the fixed output bandwidth.

Referring to the signal analyzer in the feedback loop of FIG. 1 and the signal processing circuit 100 as illustrated in FIG. 1 and FIGS. 4 through 7, the signal processing circuit 100 can be operative to switch from a staring mode to a selective mode based on processing of an output signal IF. In one embodiment, a signal analyzer can be operative to switch to a selective mode for isolation of a narrow band signal of interest in response to detection of a narrow band signal of interest in the staring mode.

Signal processing circuit 100 can be operative to dither a local oscillator signal. The signature is the relative motion of the output signal IF relative to the direction and magnitude of the dither signal. A local oscillator can include dithering control, wherein the dithering control dithers a frequency of at least one signal component of the plurality of signal components of the local oscillator signal, the dithering thereby producing a unique signal signature for the at least one signal component. A signal analyzer as shown in FIG. 1 can identify a signature of a dither control and switch a mode of operation of the signal processing circuit 100 from a staring mode to a selective mode on the detection of a narrow band signal of interest with the signal processing circuit 100 operating in the staring mode. In one embodiment, a dither control for a local oscillator applies a dither control of n times the frequency value of a dither control where n is the number of the comb line. In the example of n=10 comb lines spaced at 10 GHz increments, there will be narrow band comb lines at 10 GHz, 20 GHz, 30 GHz, 40 GHz, 50 GHz, 60 GHz, 70 GHz, 80 GHz, 90 GHz, and 100 GHz. A frequency dither of $f_{dither}$=100 MHz can be applied to the 10 GHz tone and gives a unique signature of n $f_{dither}$ to each of the n LO comb lines. Where the nth comb line produces an IF signal, the IF signal will include a unique signature corresponding to the dither signature of n $f_{dither}$. With each comb line producing a unique dither signature, the signal analyzer as illustrated in FIG. 1 is able to determine the comb line aligned to a narrow band signal of interest that may be present and accordingly is able use the information of the detected dither signature for establishing an input comb line local oscillator signal in a selective mode. As set forth herein, in the embodiment of FIG. 5, the second modulator circuitry intensity modulator and phase modulator in a wide band staring mode can be driven at sufficient power to generate first through nth order harmonic frequencies of sufficient intensity for providing each of first through nth comb lines.

As indicated by the signal analyzer block of FIG. 1, the signal processing circuit 100 can be operative to change modes of operation in response to an output signal. In general the signal processing circuit 100 can operate in a staring mode when in a new environment with unknown signal characteristics. In a staring mode signal processing circuit 100 can input a local oscillator signal including a plurality of simultaneously applied local oscillator comb lines. When a narrow band signal of interest is found (e.g. by detection of a dither signature as explained herein), the signal processing circuit 100 can switch to a selective mode. In the selective mode the signal processing circuit 100 can input a local oscillator signal based on the band of a detected narrow band signal of interest detected in the staring mode.

An optical band pass filter, BPF, of signal processing circuit 100 can have a certain pass band, e.g., $f_c$+60 GHz to $f_c$+110 GHz in one embodiment. The certain pass band can be commonly configured in a staring mode and a selective mode. Signal processing circuit 100 can be configured so that in the staring mode the band pass filter can pass $6^{th}$ to $11^{th}$ order harmonics of a 10 GHz local oscillator input signal so that comb lines 6 through 11 are passed. Signal processing circuit 100 can be configured so that in the staring mode the band pass filter can pass a second order harmonic of a narrow band local oscillator input signal in the range of 35 GHz to 50 GHz, the second order harmonic signal being a narrow band signal in the range of 70 Hz to 100 Hz. Signal processing circuit 100 can be configured so that in each of the staring mode and the selective mode, an optical band pass filter, BPF, rejects the carrier frequency $f_c$ and the local oscillator signal fundamental frequency for providing an improved signal to noise ratio.

In another aspect, the signal processing circuit 100 can be operative so that in a selective mode the local oscillator applies a local oscillator signal resulting in a higher order harmonic (e.g. second harmonic) optical signal being output by an optical circuit section of the signal processing circuit 100. In each of the staring mode and the selective mode, signal processing circuit 100 can input a local oscillator signal so that higher order harmonic signals are passed by an optical pass band filter, BPF. In the staring mode as has been set forth herein with reference to FIG. 5, multiple comb line harmonics can be passed by an optical pass band filter, BPF. In the selective mode, a single harmonic comb line can be passed by an optical band pass filter, BPF, and output by the optical circuit section. By reduction of the number of harmonics passed by an optical band pass filter, BPF, in the selective mode, noise can be reduced relative to the staring mode, and specificity can be improved. Referring further to FIG. 6, an optical signal output by an optical circuit section of signal processing circuit 100 can be input into the balanced optical receiver as shown in the signal processing circuit 100 of FIG. 6. An output optical signal can be output by being selected by a band pass filter, e.g., of the optical band pass filters (BPF) as shown in FIGS. 4 through 6. In the selective mode referring to FIG. 6, a 4× frequency amplifier that is inactive in a wide band staring mode (FIG. 5) can be active in the selective mode so that a spectral profile of an input local oscillator signal is changed. The signal processing circuit 100 can be configured so that with the optical band pass filters (BPF) configured commonly in a selective mode as in a staring mode, higher order (e.g. second) harmonic signals can be pass band selected by a filter (e.g. a filter of the band pass filters, BPF) for output by the optical circuit section of the signal processing circuit 100. In the embodiment of 6, the second modulator circuitry intensity modulator and phase modulator can be driven at sufficient power to generate a second harmonic (frequency doubled) frequency with sufficient intensity for processing in the selective mode. In the example of FIG. 6 where there is a narrow band input local oscillator frequency in the range of 35-50 GHz, a frequency doubled narrow band second harmonic frequency in the range of 75-100 GHz can be generated and selected by the optical band pass filters (BPF) for output by the optical circuit section of the signal processing circuit 100.

Referring to FIGS. 4 through 6, it is illustrated that the signal processing circuit 100 can include an optical circuit section having a laser, first modulator circuitry for input of an optical input signal into the optical circuit section and second modulator circuitry for input of a local oscillator signal into an optical circuit section. The local oscillator signal can be a spectrally shaped local oscillator signal. In the specific embodiment of FIGS. 4 through 6 the first modulator circuitry can include a phase modulator and the second modulator circuitry can include an intensity modulator in combination with a phase modulator. Referring to further aspects of the optical circuit section the optical circuit section can include a coupler shown as being provided by a 3 DB coupler, a first band pass filter (BBF) a second band pass filter (BPF) and a photodiode based optical receiver. In the embodiment of FIGS. 4 through 6, the second modulator circuitry can be used for generation of comb lines as set forth herein. In another embodiment, comb lines can be generated e.g. by generating multiple frequencies in a staring mode and deactivating one or more of the frequencies in a selective mode. In another embodiment, a bank of lasers can be phase locked to a carrier and an electrically generated lower frequency comb lines.

The signal processing circuit 100 as set forth in the embodiment of FIG. 1 and FIGS. 4-6 can be configured so that components of the optical circuit section (including or more of and in one embodiment each of the laser, first modulator circuitry the second modulator circuitry, the coupler, the first band pass filter (BPF) the second band pass filter (BPF) and the photodiode based balanced optical receiver) have common (static and unchanging) hardware configurations irrespective of modes of operation and further so that modes of operation of the signal processing circuit 100 can be changed by changing the optical local oscillator signal input into the optical circuit section by the second modulator circuitry. Changing of the local oscillator optical signal can be changed by changing electrical control inputs into the second modulator circuitry. Signal processing circuit 100 can be configured so that a high power carrier frequency (e.g. $f_c \approx 193$ THz) optical signal input by the laser is common (static and unchanging) between modes of operation. As set forth the embodiment of FIG. 1 and FIGS. 4-6, the optical local oscillator signal can be changed by changing a local oscillator RF control signal input into the modulators (IM and PM) of the second modulator circuitry. In the signal processing circuit 100 as set forth in the embodiment of FIG. 1 and FIGS. 4-6 higher frequency signals can be processed in the optical domain within the optical circuit section in various embodiments thus improving signal to noise ratio and facilitating use of lower cost optical and/or electrical hardware components.

Figure 8:
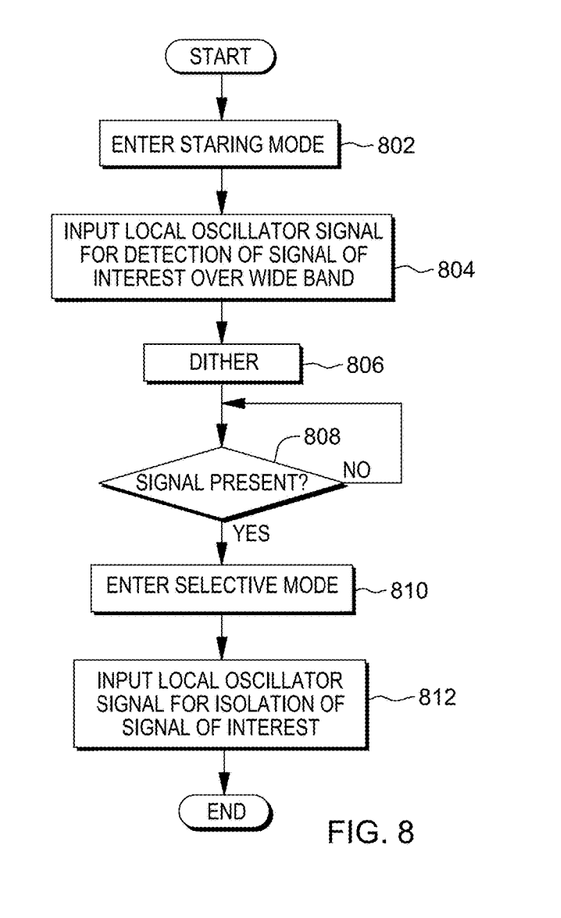
FIG. 8 is a flow diagram illustrating operation of a signal processing circuit.

A flow diagram illustrating operation of a signal processing circuit 100 is shown in FIG. 8. At block 802 the signal processing circuit 100 can enter a staring mode and at block 804 can input a local oscillator signal for detection of one or more signal of interest over a wide band. At block 804 signal processing circuit 100 can input a multiple comb line local oscillator signal into an optical circuit section of the signal processing circuit 100. At block 806 the signal processing circuit 100 can apply a dither control to the local oscillator signal to produce a dither signature on an output signal. In one embodiment, by application of a dither control a distinct dither signature can be produced at each comb line of a multiple comb line local oscillator signal. The signal analyzer (FIG. 1) can detect a dither signature included in an output signal. If a dither signal signature is detected at block 808 indicative of a signal of interest of a certain narrow band being present, the signal processing circuit 100 can enter a selective mode at block 810 for isolation of the signal of interest. At block 812, the signal processing circuit 100 can input a local oscillator signal for isolation of the signal of interest and in one embodiment additional signal processing (e.g. for encoded information decoding) as appropriate for the particular application. A local oscillator signal in a selective mode can be a narrow band single comb line signal. The selective mode can facilitate an improved signal to noise ratio of an output signal IF representing a narrow band signal of interest. In the selective mode, signal processing circuit 100 can increase or decrease a frequency of the local oscillator signal so that a higher order, e.g., second harmonic of the optical local oscillator signal can be passed by an optical band pass filter (BPF) and output by the optical circuit section. In each of the staring mode and the selective mode, signal processing circuit 100 can input a local oscillator signal so that higher order harmonic signals are passed by an optical pass band filter, BPF. In the staring mode multiple comb line harmonics can be passed by an optical pass band filter, BPF. In the selective mode, a single harmonic comb line can be passed by an optical band pass filter (BPF) and output by the optical circuit section. By reduction of the number of harmonics in the selective mode, noise can be reduced relative to the staring mode, and specificity can be improved. In a selective mode the signal analyzer (FIG. 1) can isolate a narrow band signal of interest and can perform further processing on the signal, e.g., to determine information encoded on the signal of interest.

One general aspect includes an apparatus including: a signal processing circuit that processes an input signal, the input signal having an input bandwidth spanning a range of input radio frequencies, and the signal processing circuit having a local oscillator that produces a local oscillator signal including a plurality of signal components. The apparatus also includes where the signal processing circuit is operative so that the input signal and local oscillator signal are combined to produce an output signal, the output signal having a fixed output bandwidth, and the output signal reproducing the range of input radio frequencies within the fixed output bandwidth. The apparatus also includes the signal processing circuit where the signal processing circuit translates the input signal into an optical signal. The apparatus also includes signal processing circuit where the signal processing circuit includes a laser input. The apparatus also includes signal processing circuit where the signal processing circuit includes an optical circuit section.

Implementations may include one or more of the following features. The apparatus where the first mode is a staring mode and where the second mode is a selective mode. The apparatus where the apparatus switches from the staring mode to the selective mode in response to a detection of a narrow band signal of interest. The apparatus where the signal processing circuit includes a receiver configured to recover both I and Q components. The apparatus where the first mode is a staring mode and where the second mode is a selective mode, where the local oscillator signal in the staring mode is a multiple comb line signal, where the optical signal in the selective mode is a single comb line signal. The apparatus where the optical circuit section has first modulator circuitry for input of an input signal into the optical circuit section, and second modulator circuitry for input of the local oscillator signal into the optical circuit section, where the first modulator circuitry and the second modulator circuitry have common hardware configurations whether the staring modes is active or the selective mode is active. The apparatus where the apparatus switches from the staring mode to the selective mode in response to an identifying of a signal of interest, where identifying the signal of interest includes detecting a dither signature in an output signal. The apparatus where the apparatus is configured so that a second harmonic local oscillator signal is passed by a filter of the optical circuit section in the selective mode. The apparatus where the apparatus is configured so that a higher order harmonic local oscillator signal is passed by a filter of the optical circuit section in the selective mode for output of a higher order harmonic local oscillator signal by an optical circuit section.

One general aspect includes the apparatus, where the plurality of signal components of the local oscillator signal include a plurality of single frequency signals, the plurality of single frequency signals having a uniform amplitude and being separated by a uniform frequency difference.

One general aspect includes the apparatus where the plurality of signal components of the local oscillator signal include a plurality of single frequency signals, the plurality of single frequency signals being separated by a uniform frequency difference.

One general aspect includes the apparatus where the local oscillator combines the input signal and local oscillator signal, and combining the input signal and local oscillator signal includes folding the range of input radio frequencies into one or more single frequency signals of the plurality of single frequency signals.

One general aspect includes the apparatus further including an input phase modulator, the input phase modulator modulating the input radio frequencies to an input optical signal, and the input optical signal being combined with the local oscillator signal.

One general aspect includes the apparatus where the input phase modulator and local oscillator include an optical interferometer circuit, and where a size of the optical interferometer circuit is minimized to thereby reduce variable phase modulation and maximize coherence of an upconverted input signal.

One general aspect includes the apparatus of where the fixed output bandwidth is approximately 5 gigahertz (GHz).

One general aspect includes the apparatus where the local oscillator further includes a dithering control, where the dithering control dithers a frequency of at least one signal component of the plurality of signal components of the local oscillator signal, the dithering thereby producing a unique signal signature to the at least one signal component.

One general aspect includes the apparatus further including a signal selector, the signal selector facilitating isolating the unique signal signature of the at least one signal component, where the output signal is modified to reproduce one input radio frequency of the range of input radio frequencies within the fixed output bandwidth.

One general aspect includes the apparatus where the output signal having a fixed output bandwidth is output in a staring mode, and where the apparatus further has a narrow band mode, where the signal processing circuit in the narrow band mode dithers a frequency of at least one signal component of the plurality of signal components.

One general aspect includes the apparatus, where the output signal reproducing the range of input radio frequencies within the fixed output bandwidth is output in a staring mode, and where the apparatus further has a selective mode where an output signal of the apparatus isolates a narrow band signal of interest.

Implementations may include one or more of the following features. The apparatus where the signal processing circuit includes a receiver configured to recover both I and Q components. The apparatus where the first mode is a staring mode and where the second mode is a selective mode, where the local oscillator signal in the staring mode is a multiple comb line signal, where the optical signal in the selective mode is a single comb line signal. The apparatus where the optical circuit section has first modulator circuitry for input of an input signal into the optical circuit section, and second modulator circuitry for input of the local oscillator signal into the optical circuit section, where the first modulator circuitry and the second modulator circuitry have common hardware configurations between modes of operation whether the staring modes is active or the selective mode is active. The apparatus where the apparatus switches from the staring mode to the selective mode in response to an identifying of a signal of interest, where identifying the signal of interest includes detecting a dither signature in an output signal. The apparatus where the apparatus is configured so that a higher order, e.g., second harmonic local oscillator signal is passed by a filter of the optical circuit section in the selective mode.

One general aspect includes the where one or more of the staring mode or the narrow band mode are user selectable.

One general aspect includes an apparatus including: a signal processing circuit having an optical circuit section that combines an input signal with a local oscillator signal. The apparatus also includes where the oscillator to establish a first mode of operation inputs a first spectrally shaped local oscillator signal into the optical circuit section. The apparatus also includes where the oscillator to establish a second mode of operation inputs a second spectrally shaped oscillator signal into the optical circuit section.

Implementations may include one or more of the following features. The apparatus where the first mode is a staring mode and where the second mode is a selective mode, where the local oscillator signal in the staring mode is a multiple comb line signal, where the optical signal in the selective mode is a single comb line signal. The apparatus where the optical circuit section has first modulator circuitry for input of an input signal into the optical circuit section, and second modulator circuitry for input of the local oscillator signal into the optical circuit section, where the first modulator circuitry and the second modulator circuitry have common hardware configurations whether the staring modes is active or the selective mode is active. The apparatus where the apparatus switches from the staring mode to the selective mode in response to an identifying of a signal of interest, where identifying the signal of interest includes detecting a dither signature in an output signal. The apparatus where the apparatus is configured so that a second harmonic local oscillator signal is passed by a filter of the optical circuit section in the selective mode.

One general aspect includes an apparatus including: a signal processing circuit having an optical circuit section that combines an input signal and a local oscillator signal. Implementations may include one or more of the following features. The apparatus also includes where the signal processing circuit is operative to input a narrow band local oscillator signal into the optical circuit section. The apparatus also includes where the signal processing circuit is configured so that when the narrow band local oscillator signal is active, a higher order, e.g., second harmonic of the narrow band local oscillator is passed by a filter of the optical circuit section for output of the higher order harmonic signal by the optical circuit section.

One general aspect includes an apparatus including: a signal processing circuit having an optical circuit section that combines an input signal and a local oscillator signal. Implementations may include one or more of the following features. The apparatus also includes where the signal processing circuit is operative to input a narrow band local oscillator signal into the optical circuit section. The apparatus also includes where the signal processing circuit is configured so that when the narrow band local oscillator signal is active, a second harmonic of the narrow band local oscillator signal is passed by a filter of the optical circuit section for output of the narrow band local oscillator signal by the optical circuit section.

Additional aspects of apparatus, systems and methods are set forth in and illustrated by the figures in Appendix A which forms part of the present disclosure which is appended hereto and which is incorporated herein by reference by way of being included in U.S. Provisional Application No. 62/152,538 filed Apr. 24, 2015, entitled, "SIGNAL PROCESSING CIRCUIT WITH FREQUENCY DOMAIN FOLDER" which is incorporated herein by reference in its entirety.

A small sample of embodiments of apparatus set forth in the present disclosure include:

A1. An apparatus comprising: a signal processing circuit that processes an input signal, the input signal having an input bandwidth spanning a range of input radio frequencies, and the signal processing circuit having a local oscillator that produces a local oscillator signal comprising a plurality of signal components; wherein the signal processing circuit is operative so that the input signal and local oscillator signal are combined to produce an output signal, the output signal having a fixed output bandwidth, and the output signal reproducing the range of input radio frequencies within the fixed output bandwidth. A2 The apparatus of A1, wherein the input signal is an electrical input signal and wherein the signal processing circuit translates the input signal into an optical input signal. A3 The apparatus of A1, wherein the signal processing circuit includes a laser input. A4. The apparatus of A1, wherein the signal processing circuit includes an optical circuit section. A5. The apparatus of A1, wherein the plurality of signal components of the local oscillator signal comprise a plurality of single frequency signals, the plurality of single frequency signals having a uniform amplitude and being separated by a uniform frequency difference. A6. The apparatus of A1, wherein the plurality of signal components of the local oscillator signal comprise a plurality of single frequency signals, the plurality of single frequency signals being separated by a uniform frequency difference. A7. The apparatus of A1, wherein the local oscillator combines the input signal and local oscillator signal, and combining the input signal and local oscillator signal comprises folding the range of input radio frequencies into one or more single frequency signals of the plurality of single frequency signals. A8. The apparatus of A1, further comprising an input phase modulator, the input phase modulator modulating the input radio frequencies to an input optical signal, and the input optical signal being combined with the local oscillator signal. A9. The apparatus of A1, wherein the input phase modulator and local oscillator comprise an optical interferometer circuit, and wherein a size of the optical interferometer circuit is minimized to thereby reduce variable phase modulation and maximize coherence of an upconverted input signal. A10. The apparatus of A1, wherein the fixed output bandwidth is approximately 5 gigahertz (GHz). A11. The apparatus of A1, wherein the local oscillator further comprises a dithering control, wherein the dithering control dithers a frequency of at least one signal component of the plurality of signal components of the local oscillator signal, the dithering thereby producing a unique signal signature to the at least one signal component. A12. The apparatus of A11, further comprising a signal selector, the signal selector facilitating isolating the unique signal signature of the at least one signal component, wherein the output signal is modified to reproduce one input radio frequency of the range of input radio frequencies within the fixed output bandwidth. A13. The apparatus of A1, further including a radio-frequency source. A14. The apparatus of A1, wherein the output signal having a fixed output bandwidth is output in a staring mode, and wherein the apparatus further has a narrow band mode, wherein the signal processing circuit in the narrow band mode dithers a frequency of at least one signal component of the plurality of signal components. A15. The apparatus of A1, wherein the output signal reproducing the range of input radio frequencies within the fixed output bandwidth is output in a staring mode, and wherein the apparatus further has a selective mode wherein an output signal of the apparatus isolates a narrow band signal of interest. A16. The apparatus of A15, wherein one or more of the staring mode or the narrow band mode are user selectable. A17. The apparatus of A1, wherein the signal processing circuit includes a receiver configured to recover both I and Q components. B1. An apparatus comprising: a signal processing circuit having an optical circuit section that combines an input signal with a local oscillator signal; wherein the oscillator to establish a first mode of operation inputs a first spectrally shaped local oscillator signal into the optical circuit section; wherein the oscillator to establish a second mode of operation inputs a second spectrally shaped oscillator signal into the optical circuit section. B2. The apparatus of B1, wherein the first mode is a staring mode and wherein the second mode is a selective mode. B3. The apparatus of B2, wherein the apparatus switches from the staring mode to the selective mode in response to a detection of a narrow band signal of interest. B4. The apparatus of B 1, wherein the first mode is a staring mode and wherein the second mode is a selective mode, wherein the local oscillator signal in the staring mode is a multiple comb line signal, wherein the optical signal in the selective mode is a single comb line signal. B5. The apparatus of B4, wherein the optical circuit section has first modulator circuitry for input of an input signal into the optical circuit section, and second modulator circuitry for input of the local oscillator signal into the optical circuit section, wherein a hardware configuration of the first modulator circuitry when the staring mode is active is in common with a hardware configuration of the first modulator circuitry when the staring mode is active, wherein a hardware configuration of the second modulator circuitry when the staring mode is active is in common with a hardware configuration of the second modulator circuitry when the staring mode is active. B6. The apparatus of B4, wherein the apparatus switches from the staring mode to the selective mode in response to an identifying of a signal of interest, wherein identifying the signal of interest includes detecting a dither signature in an output signal. B7. The apparatus of B1, wherein the local oscillator signal in the first mode is a multiple comb line signal, wherein the optical signal in the second mode is comb line signal having a number of comb lines reduced relative to a number of comb lines of the multiple comb line signal in the first mode. B8. The apparatus of B1, wherein the apparatus is configured so that a higher order harmonic local oscillator signal is passed by a filter of the optical circuit section in the selective mode. C1. An apparatus comprising: a signal processing circuit having an optical circuit section that combines an input signal and a local oscillator signal; wherein the signal processing circuit is operative to input a narrow band local oscillator signal into the optical circuit section; m wherein the signal processing circuit is configured so that when the narrow band local oscillator signal is active, a higher order harmonic signal of the narrow band local oscillator signal is output by the optical circuit section. C2. The apparatus of C1, wherein the optical circuit section includes a filter, the filter selectively passing the higher order harmonic signal. C3. The apparatus of C1, wherein the optical circuit section includes a filter, the filter selectively passing the higher order harmonic signal and being operative to reject the fundamental frequency of the higher order harmonic signal and a carrier frequency of a carrier frequency signal of the optical circuit section. C4. The apparatus of C1, wherein the higher order harmonic signal of the narrow band local oscillator signal is output by the optical circuit section to an optical receiver.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present disclosure has been presented for purposes of illustration and description, but is not intended to be exhaustive or limited to the form disclosed. Many modifications and variations will be apparent to those of ordinary skill in the art without departing from the scope and spirit of the disclosure. Embodiments herein were chosen and described in order to best explain the principles of one or more aspects of the disclosure and the practical application, and to enable others of ordinary skill in the art to understand one or more aspects of the disclosure for various embodiments with various modifications as are suited to the particular use contemplated.

What is claimed is:

1. An apparatus comprising:
    a signal processing circuit that processes an input electrical signal, the input electrical signal having an input bandwidth within a range of input radio frequencies, and the signal processing circuit having a local oscillator that produces a local oscillator signal comprising a plurality of signal components, wherein the signal processing circuit includes an optical circuit section and wherein the signal processing circuit is operative to translate the input electrical signal into an input optical signal;
    wherein the signal processing circuit is operative so that combination of the input optical signal and the local oscillator signal in the optical circuit section produces an output signal having a fixed output bandwidth, the output signal reproducing the range of input radio frequencies within the fixed output bandwidth, wherein the local oscillator to establish a first staring mode of operation inputs a first spectrally shaped local oscillator signal into the optical circuit section, and wherein the local oscillator to establish a second selective mode of operation inputs a second spectrally shaped local oscillator signal into the optical circuit section, wherein the signal processing circuit includes electrical circuitry for switching from the staring mode of operation to the selective mode of operation in response to an analyzing of the output signal with the first staring mode of operation active.

2. The apparatus of claim 1, wherein the plurality of signal components of the local oscillator signal comprise a plurality of single frequency signals, the plurality of single frequency signals having a uniform amplitude and being separated by a uniform frequency difference.

3. The apparatus of claim 1, wherein the signal processing circuit folds the range of input radio frequencies into the fixed output bandwidth using an electrical domain filter having the fixed output bandwidth.

4. The apparatus of claim 1, comprising an input phase modulator, the input phase modulator modulating the input radio frequencies to the input optical signal, and the input optical signal being combined with the local oscillator signal.

5. The apparatus of claim 4, wherein the input phase modulator and local oscillator comprise an optical interferometer circuit, and wherein a size of the optical interferometer circuit is minimized to thereby reduce variable phase modulation and maximize coherence of an upconverted input signal.

6. The apparatus of claim 1, wherein the local oscillator further comprises a dithering control, wherein the dithering control dithers a frequency of at least one signal component of the plurality of signal components of the local oscillator signal, the dithering thereby producing a unique signal signature to the at least one signal component, and wherein the analyzing includes detecting for the unique signal signature.

7. The apparatus of claim 1, wherein the signal processing circuit includes a receiver configured to recover both I and Q components.

8. The apparatus of claim 1, wherein the signal processing circuit has first modulator circuitry for input of an input signal into the optical circuit section, and second modulator circuitry for input of the local oscillator signal into the optical circuit section.

9. The apparatus of claim 1, wherein the optical circuit section includes a laser that provides an optical signal having a carrier frequency that is common between the staring mode of operation and the selective mode of operation.

10. The apparatus of claim 1, wherein the optical circuit section includes an optical pass band filter, wherein the first spectrally shaped signal is shaped so that multiple comb line harmonics are passed by the optical pass band filter in the staring mode, and wherein the second spectrally shaped signal is shaped so that a number of comb line harmonics passed by the optical pass band filter in the selective mode of operation is reduced relative to a number of comb line harmonics passed by the optical pass band filter in the staring mode of operation.

11. The apparatus of claim 1, wherein the optical circuit section includes an optical pass band filter, and wherein the signal processing circuit drives the local oscillator with a higher frequency driving signal in the selective mode than in the staring mode.

12. The apparatus of claim 1, wherein the optical circuit section includes an optical pass band filter, and wherein the signal processing circuit drives the local oscillator with a higher frequency driving signal in the selective mode than in the staring mode, and wherein the signal processing in the selective mode drives the local oscillator so that only a second sideband of the input optical signal falls within a pass band of the optical pass band filter.

13. The apparatus of claim 1, wherein the local oscillator produces the plurality of signal components in the first staring mode of operation and one or more signal component in the selective mode.

14. An apparatus comprising:
a signal processing circuit having an optical circuit section that combines an input optical signal with a local oscillator signal, wherein the input optical signal is an input optical signal translated from an input electrical signal having an input bandwidth within a range of input radio frequencies;
wherein the signal processing circuit is operative so that combination of the input optical signal and the local oscillator signal in the optical circuit section produces an output signal having a fixed output bandwidth, the output signal reproducing the range of input radio frequencies within the fixed output bandwidth;
wherein a local oscillator to establish a first mode of operation inputs a first spectrally shaped local oscillator signal into the optical circuit section; and
wherein the local oscillator to establish a second mode of operation inputs a second spectrally shaped local oscillator signal into the optical circuit section, wherein the first mode of operation is a staring mode and wherein the second mode of operation is a selective mode, and wherein the apparatus switches from the staring mode to the selective mode in response to a detection of a narrow band signal of interest.

15. The apparatus of claim 14, wherein the optical circuit section has first modulator circuitry for input of an input signal into the optical circuit section, and second modulator circuitry for input of the local oscillator signal into the optical circuit section, wherein a hardware configuration of the first modulator circuitry when the staring mode is active is in common with a hardware configuration of the first modulator circuitry when the selective mode is active, wherein a hardware configuration of the second modulator circuitry when the staring mode is active is in common with a hardware configuration of the second modulator circuitry when the selective mode is active.

16. The apparatus of claim 14, wherein the local oscillator signal in the first mode of operation is a multiple comb line signal, wherein the optical signal in the second mode of operation is comb line signal having a number of comb lines reduced relative to a number of comb lines of the multiple comb line signal in the first mode of operation.

17. The apparatus of claim 14,
wherein the signal processing circuit is operative to input a narrow band local oscillator signal into the optical circuit section;
wherein the signal processing circuit is configured so that when the narrow band local oscillator signal is active, a higher order harmonic signal of the narrow band local oscillator signal is output by the optical circuit section, wherein the optical circuit section includes a filter, the filter selectively passing the higher order harmonic signal and being operative to reject the fundamental frequency of the higher order harmonic signal and a carrier frequency of a carrier frequency signal of the optical circuit section.

18. The apparatus of claim 14, wherein the signal processing circuit comprises electrical circuitry for switching from the staring mode to the selective mode in response to an analyzing of an output signal of the signal processing circuit with the first mode of operation active.

19. The apparatus of claim 18, wherein the signal processing circuit folds the range of input radio frequencies into the fixed output bandwidth using an electrical domain filter having the fixed output bandwidth.

20. The apparatus of claim 18, wherein the first spectrally shaped local oscillator signal input into the optical circuit section in the first mode of operation is a multiple comb line signal and wherein the second spectrally shaped local oscillator signal in the second mode of operation is a comb line signal having a number of comb lines reduced relative to a number of comb lines of the multiple comb line signal in the first mode of operation.

21. The apparatus of claim 18, wherein the optical circuit section includes a filter, the filter selectively passing a higher order harmonic signal of the local oscillator in the staring mode, and selectively passing a higher order harmonic signal of the oscillator signal in the selective mode.

22. The apparatus of claim 18, wherein the analyzing of an output signal of the signal processing circuit with the first mode of operation active includes detecting a signature of the first spectrally shaped local oscillator signal.

23. The apparatus of claim 18, wherein the optical circuit section includes an optical pass band filter, wherein the first spectrally shaped signal is shaped so that multiple comb line harmonics are passed by the optical pass band filter in the staring mode, and wherein the second spectrally shaped signal is shaped so that a number of comb line harmonics passed by the optical pass band filter in the selective mode is reduced relative to a number of comb line harmonics passed by the optical pass band filter in the staring mode.

24. The apparatus of claim 18, wherein the first spectrally shaped local oscillator signal is characterized by spaced comb lines defined by a fundamental frequency comb line and harmonic signal comb lines.

25. An apparatus comprising:
a signal processing circuit having an optical circuit section that combines an input signal with a local oscillator signal;
wherein an oscillator to establish a staring mode of operation inputs a first spectrally shaped local oscillator signal into the optical circuit section; and
wherein the oscillator to establish a selective mode of operation inputs a second spectrally shaped oscillator signal into the optical circuit section, wherein the local oscillator signal in the staring mode is a multiple comb line signal, wherein the optical signal in the selective mode is a single comb line signal, wherein the apparatus switches from the staring mode to the selective mode in response to an identifying of a signal of interest, wherein identifying the signal of interest includes detecting a dither signature in an output signal.

* * * * *